United States Patent
Ker et al.

(10) Patent No.: US 7,123,236 B2
(45) Date of Patent: Oct. 17, 2006

(54) LEVEL SHIFTER WITH BODY-BIASED CIRCUIT

(75) Inventors: Ming-Dou Ker, Hsinchu (TW); Wen-Hsia Kung, Taoyuan (TW); Ya-Hsiang Tai, Hsinchu (TW)

(73) Assignee: TPO Displays Corporation, Miao-Li County (TW)

( * ) Notice: Subject to any disclaimer, the term of this patent is extended or adjusted under 35 U.S.C. 154(b) by 546 days.

(21) Appl. No.: 10/691,530

(22) Filed: Oct. 24, 2003

(65) Prior Publication Data

US 2004/0257327 A1    Dec. 23, 2004

(30) Foreign Application Priority Data

Oct. 25, 2002   (TW) .............................. 91124958 A

(51) Int. Cl.
   *G09G 3/36*   (2006.01)
(52) U.S. Cl. .................... 345/98; 345/100; 326/80
(58) Field of Classification Search ................ 345/98, 345/96, 99, 100, 92, 205, 211, 55; 326/80, 326/83, 68, 81, 86
   See application file for complete search history.

(56) References Cited

U.S. PATENT DOCUMENTS 6,222,395 B1 *   4/2001   Bertin et al. ................. 327/77

FOREIGN PATENT DOCUMENTS

JP        2002-280895        *   9/2002

* cited by examiner

*Primary Examiner*—Richard Hjerpe
*Assistant Examiner*—Abbas Abdulselam
(74) *Attorney, Agent, or Firm*—Michael Bednarek; Pillsbury Winthrop Shaw Pittman LLP

(57) ABSTRACT

A level shifter, with body-biased circuits, is provided for applying in a thin film transistor liquid crystal display (TFT-LCD). The body-biased circuits are configured to bias the bodies of the input terminal transistors of the level shifter so that the threshold voltages of the input terminal transistors are adjustable. This level shifter is capable of operating at a high frequency with low power consumption while a low-level signal is inputting.

18 Claims, 3 Drawing Sheets

US 7,123,236 B2

LEVEL SHIFTER WITH BODY-BIASED CIRCUIT

This application claims priority to Taiwan Patent Application No. 091124958 filed on Oct. 25, 2002.

FIELD OF INVENTION

The present invention discloses a level shifter applicable in thin film transistor liquid crystal displays (TFT-LCDs).

BACKGROUND OF THE INVENTION

To drive all the electronic elements within a thin film transistor liquid crystal display (TFT-LCD), the TFT-LCD requires a level shifter to shift from an input voltage level, which may come from a computer-like device, to an output voltage level. Because the threshold voltage of TFTs is larger than that of CMOSs, most TFT-LCDs of prior art utilize a detection circuit to avoid bad performance of the level shifter caused by excessive-low input voltage.

FIG. 1 shows a level shifter of prior art. With reference to FIG. 1, the basic structure of the level shifter includes a shift circuit 32, a first detection circuit 27, and a second detection circuit 29. The shift circuit 32 includes a pair of input transistors, a first transistor 2 and a second transistor 4, and a pair of load transistors, a third transistor 6 and a fourth transistor 8. The first detection circuit 27 includes a fifth transistor 10, a first input terminal 18, and a first current source 14. The second detection circuit 29 includes a sixth transistor 12, a second input terminal 20, and a second current source 16. The input signals of the first input terminal 18 and the second input terminal 20 need complementary voltage levels. The fifth transistor 10 and the sixth transistor 12 are configured herein to detect the threshold voltages of the first transistor 2 and the second transistor 4 respectively to maintain that the operations of the first transistor 2 and the second transistor 4 are in an appropriate mode. Accordingly, the level shifters can perform as expected.

FIG. 2 shows another level shifter of prior art. The basic structures illustrated in FIG. 1 and FIG. 2 are identical except for different gate connections of the third transistor 6 and the fourth transistor 8. FIG. 3 shows a further improved level shifter of prior art, which is identical to the level shifter illustrated in FIG. 1 except the addition of a seventh transistor 13. With the seventh transistor 13 and its specific connection way, the level shifter in FIG. 3 can, without the second input terminal 20, perform the functions of level shifters in FIG. 1 and FIG. 2.

The operation frequency of TFT-LCDs has been increasing due to ever-increasing amount of data that needs to be processed during its transmission. However, the always-active status of the first transistor 2 and the second transistor 4 limits the speed improvement of the aforementioned level shifters. Besides, the aforementioned level shifters have two DC routes which go from the current sources (the first current source 14 and the second current source 16) to ground via the detection transistors (the fifth transistor 10 and the sixth transistor 12). These two DC routes result in unnecessary power consumption while the power supply 30 is supplied regardless whether the level shifters are operating or not because the connections of the fifth transistor 10 and the sixth transistor 12 require this constant power supply.

SUMMARY OF THE INVENTION

The aspect of the present invention is to provide a level shifter with the advantages of high speed, low input voltage, and low power consumption.

The present invention provides a level shifter for use in TFT-LCDs. It includes a shift circuit and two bias circuits. The shift circuit, having two input transistors and two load transistors, is configured to shift from an input voltage level to an output voltage level. Each bias circuit has an input terminal connected to one input terminal of the shift circuit, and has an output terminal connected to the body of either input transistor to adjust the threshold voltage of the input transistor according to the input voltage level. The level shifter of the present invention can, therefore, operate well in high speed and with low input voltage, and also can eliminate the DC power consumption by implanting the bias circuits.

DETAILED DESCRIPTION

The present invention provides a level shifter for use in TFT-LCDs. The level shifter including at least one bias circuit is configured to shift from an input voltage level to an output voltage level. The bias circuit can adjust the threshold voltages of the input transistors within the level shifter by biasing the input transistors. The level shifter of the present invention is capable of operating in a high frequency with low input voltage and, moreover, is capable of decreasing power consumption.

The threshold voltage of TFTs can be derived by the following equation:

$$V_{th}=V_{th0}+\gamma[\sqrt{2\Phi_f+V_{SB}}-\sqrt{2\Phi_f}]$$

wherein $\gamma$ and $\Phi_f$ are parameters for the specific semiconductor process, $V_{SB}$ is the potential difference between the source and the body, $V_{th0}$ is the threshold voltage at $V_{SB}=0$, and $V_{th}$ is the practical threshold voltage. According to the above equation, there are two methods to decrease the threshold voltage of TFTs. One is to adjust $\gamma$ and $\Phi_f$, and the other is to modify $V_{SB}$. However, it is not economical to decrease the threshold voltage of TFTs by adjusting the semiconductor process parameters in terms of time and cost. Therefore, the present invention implants a bias function circuitry into a level shifter so that the level of the threshold voltage of TFTs would depend on the swing of an input signal.

The level shifter of the present invention includes a shift circuit and at least one bias circuit. The shift circuit, including two input transistors and two load transistors, is configured to shift from an input voltage level to an output voltage level. Both of the input transistors are n-channel TFTs and have a source, a drain, a gate, and a body. Both of the load transistors are p-channel TFTs and have a source, a drain, and a gate. The bias circuit includes an input terminal and an output terminal respectively, and is configured to bias the body of one of the input transistors. The output terminal is connected to the body of one of the input transistors to modify the threshold voltage of the input transistor.

Figure 1:
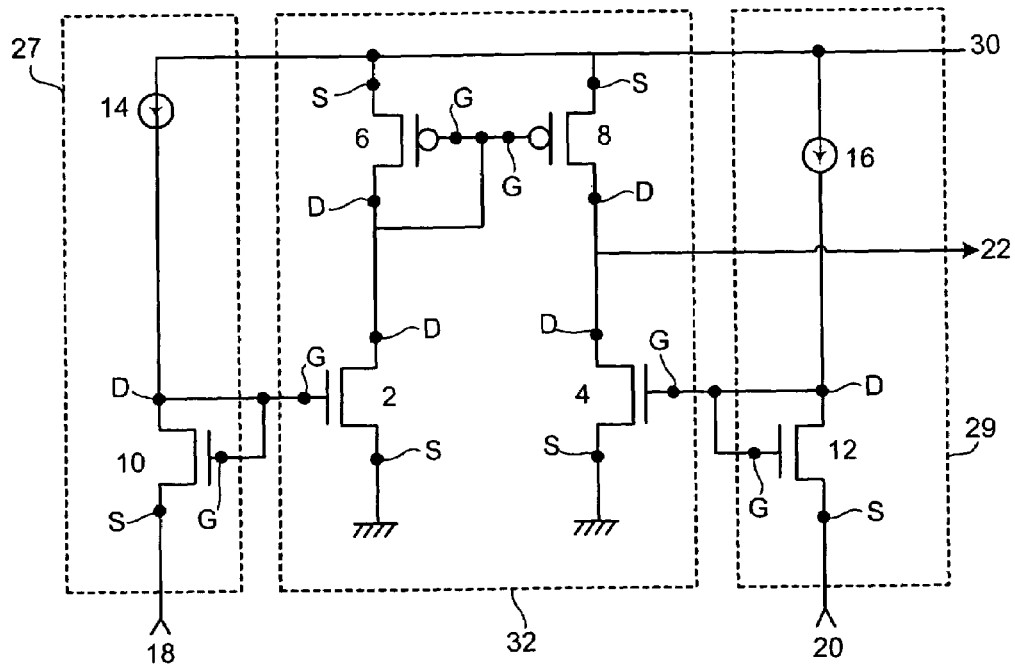
FIG. 1 shows the circuitry of a level shifter of prior art.
Figure 2:
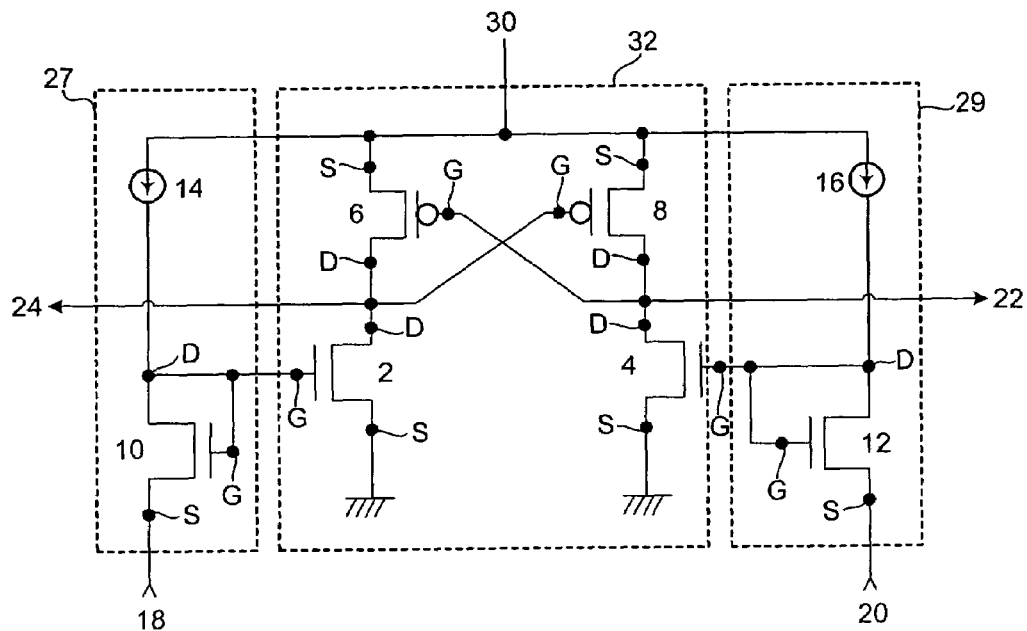
FIG. 2 shows the circuitry of another level shifter of prior art.
Figure 3:
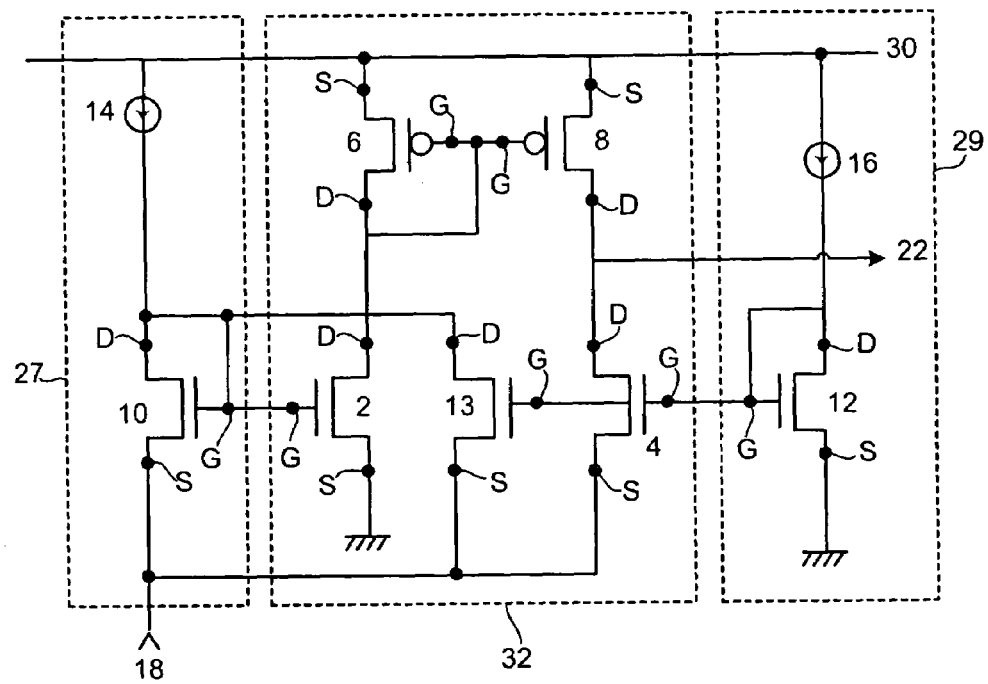
FIG. 3 shows the circuitry of another level shifter of prior art.
Figure 4:
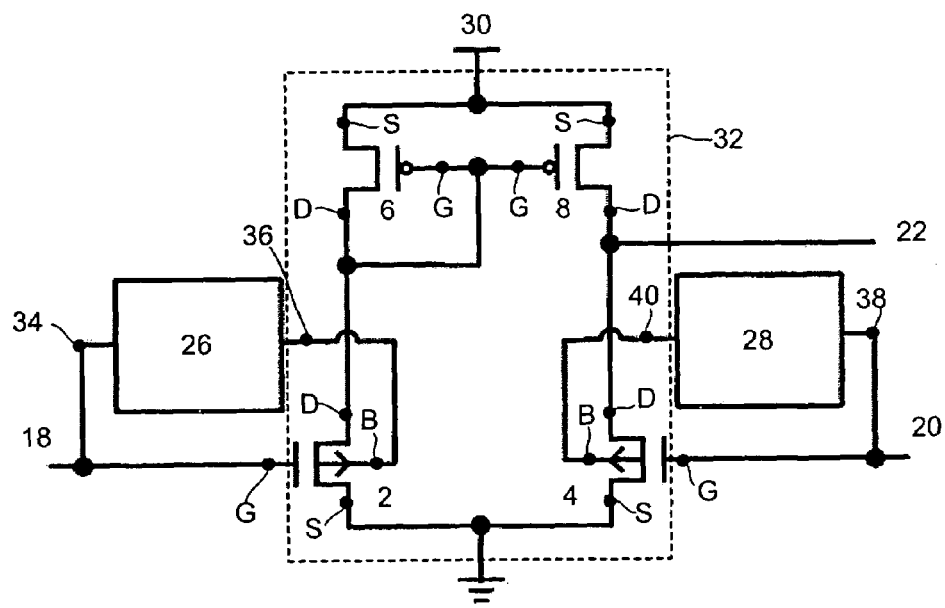
FIG. 4 shows the circuitry of the first exemplary embodiment in accordance with this invention.

FIG. 4 shows the first exemplary embodiment of the present invention. In FIG. 4, a shift circuit 32 includes a first input terminal 18, a second input terminal 20, a first transistor 2, a second transistor 4, a third transistor 6 and a fourth transistor 8. The first input terminal 18 is configured to input the input voltage level and the second input terminal 20 is configured to input the same input voltage level but with opposite phase. The input terminal 34 of a first bias circuit 26 is connected to the first input terminal 18 and the gate of the first transistor 2. The output terminal 36 of the first bias circuit 34 is connected to the body of the first transistor 2. The input terminal 38 of a second bias circuit 28 is connected to the second input terminal 20 and the gate of the second transistor 4. The output terminal 40 of the second bias circuit 28 is connected to the body of the second transistor 4. The sources of the first transistor 2 and the second transistor 4 are both grounded. The drain of the first transistor 2 is connected to the drain of the third transistor 6. The drain of second transistor 4 is connected to the drain of the fourth transistor 8. The gate of the third transistor 6 is connected to the drain of the third transistor 6. The gate of the fourth transistor 8 is connected to the gate of the third transistor 6. The sources of the third transistor 6 and the fourth transistor 8 are both connected to a power supply 30. The drain of the fourth transistor 8 is a first output terminal 22 from which the output voltage level can be extracted.

When the signal coming into the first input terminal 18 is high (e.g. 5V) or the signal coming into the second input terminal 20 is low (e.g. 0V), the signals pass through the first bias circuit 26 and the second bias circuit 28 respectively, and then reach the bodies of the first transistor 2 and the second transistor 4 respectively. The signals raise the potential at the body of the first transistor 2 and lower the potential at the body of the second transistor 4. According to the above equation, the threshold voltage of the first transistor 2 would decrease (e.g. from 3.5V to 2V) and the threshold voltage of the second transistor 4 would increase (e.g. from 2V to 3.5V). Therefore, the potential at the gate of the first transistor 2 turns higher than its threshold voltage so that the first transistor 2 is on. The potential at the gate of the second transistor 4 turns lower than its threshold voltage so that the second transistor 4 is off. This operation makes the shift circuit 32 perform like an amplifier. The signal of the first output terminal 22 (e.g. 12V) amplifies the signal coming into the first input terminal 18. On the contrary, when the signal coming into the first input terminal 18 is low or the signal coming into the second input terminal 20 is high, the threshold voltage of the first transistor 2 would increase and that of the second transistor 4 would decrease. The potential at the gate of the first transistor 2 turns lower than its threshold voltage so that the first transistor 2 is off. The potential at the gate of the second transistor 4 turns higher than its threshold voltage so that the second transistor 4 is on. Accordingly, the potential at the first output terminal 22 is pulled as low as the potential difference between the drain and the source of the second transistor 4, which is close to 0V. Based on the aforementioned descriptions, the signal of the first output terminal 22 is amplified with the same phase as the signal of the first input terminal 18.

When the signal of the first input terminal 18 is high, the potential at the body of the first transistor 2 is required to be high to accomplish the above operations. Similarly, when the signal of the first input terminal 18 is low, the potential at the body of the first transistor 2 is required to be low as well. Therefore, the first bias circuit 26, as well as the second bias circuit 28, can be implemented by a buffer or two inverters in serial. The structure of bias circuits is not limited to the above-mentioned two. Any static-logic circuit having the same function is suitable herein.

Figure 5:
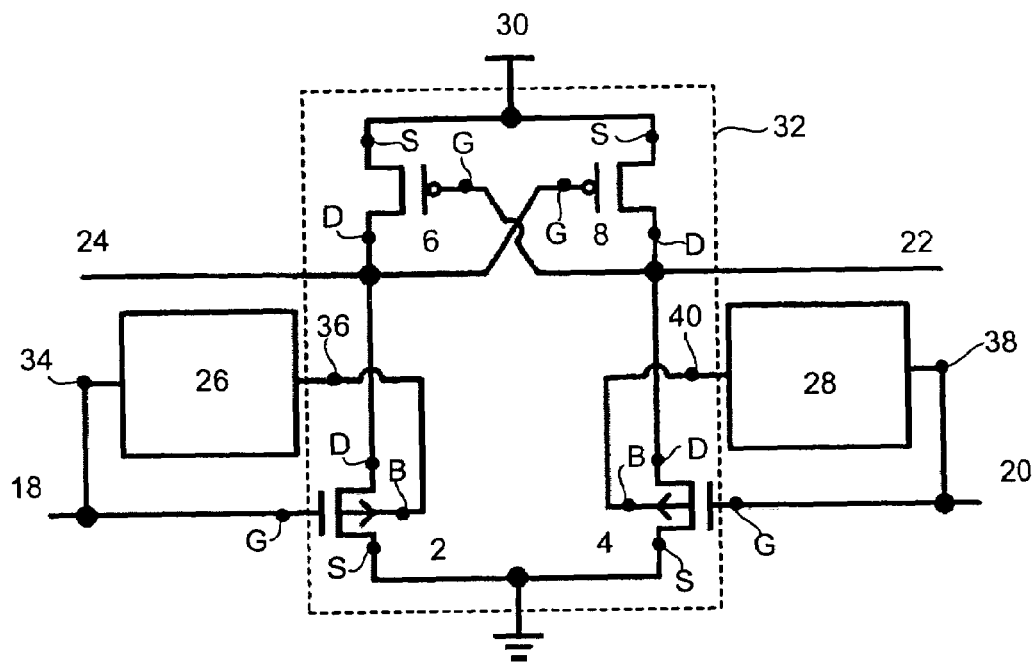
FIG. 5 shows the circuitry of the second exemplary embodiment in accordance with this invention.
Figure 6:
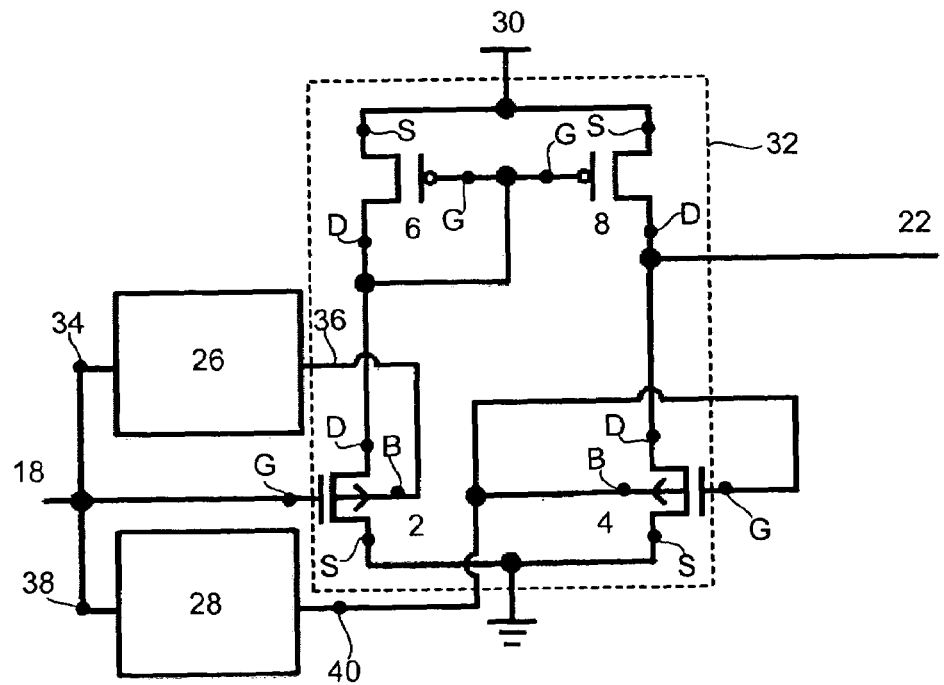
FIG. 6 shows the circuitry of the third exemplary embodiment in accordance with this invention.

FIG. 5 shows the second exemplary embodiment of the present invention. The structure of the second exemplary embodiment is identical to that of the first exemplary embodiment illustrated in FIG. 4 except that the gate of the third transistor 6 is connected to the drain of the fourth transistor 8 and that the gate of the fourth transistor 8 is connected to the drain of the third transistor 6. These connections result in the birth of a second output terminal 24 whose output signal is the same as the output signal of the first output terminal 22 but with opposite phase. FIG. 6 shows the third exemplary embodiment of the present invention. The structure of the third exemplary embodiment is also identical to that of the first exemplary embodiment except that the gate and body of the second transistor 4 are both connected to the output terminal 40 of the second bias circuit 28 and that the input terminal 38 of the second bias circuit 28 is connected to the first input terminal 18. These modified connections enable the level shifter to do without the second input terminal 20 and, therefore, the third exemplary embodiment can be applied to those devices that have only one input signal. The operation analysis of the second and third exemplary embodiments is the same with that of the first exemplary embodiment having been described above.

The level shifter of the present invention is capable of adjusting the threshold voltage of the input transistors by implanting the aforementioned bias circuits so that the threshold voltage is adjustable while the level of the input signal is changing. Accordingly, the level shifter of the present invention is capable of working in a low voltage environment, i.e. in a high frequency, without DC consumption caused by use of a static-logic circuit in the bias circuits.

The invention claimed is:

1. A level shifter for use in thin film transistor liquid crystal displays (TFT-LCD), comprising:
   a shift circuit for shifting from an input voltage level to an output voltage level, comprising:
      a first transistor comprising a source, a drain, a gate, and a body; and
      a second transistor comprising a source, a drain, a gate, and a body; and
   a first bias circuit, comprising an input terminal and an output terminal;
   wherein the output terminal of the first bias circuit is connected to the body of the first transistor to adjust a threshold voltage of the first transistor according to the input voltage level.

2. The level shifter of claim 1, wherein the first transistor and the second transistor are both n-channel TFTs.

3. The level shifter of claim 2, further comprising a second bias circuit, comprising an input terminal and an output terminal, for biasing the body of the second transistor, the shift circuit comprises:
   a first input terminal for inputting the input voltage level;
   a second input terminal for inputting the input voltage level but with opposite phase;

a third transistor being a p-channel TFT and comprising a source, a drain, and a gate; and a fourth transistor being a p-channel TFT and comprising a source, a drain, and a gate;

wherein the input terminal of the first bias circuit is connected to the gate of the first transistor, the input terminal of the second bias circuit is connected to the gate of the second transistor, the sources of the first transistor and the second transistor are both grounded, the gate of the first transistor is connected to the first input terminal, the drain of the first transistor is connected to the drain of the third transistor, the gate of the second transistor is connected to the second input terminal, the drain of second transistor is connected to the drain of the fourth transistor, the gate of the third transistor is connected to the drain of the third transistor, the gate of the fourth transistor is connected to the gate of the third transistor, the sources of the third transistor and the fourth transistor are both connected to a power supply, and the output voltage level is extracted from the drain of the fourth transistor.

4. The level shifter of claim 2, further comprising a second bias circuit, comprising an input terminal and an output terminal, for biasing the body of the second transistor, the shift circuit comprises:

a first input terminal for inputting the input voltage level;

a second input terminal for inputting the input voltage level but with opposite phase;

a third transistor being a p-channel TFT and comprising a source, a drain, and a gate; and a fourth transistor being a p-channel TFT and comprising a source, a drain, and a gate;

wherein the input terminal of the first bias circuit is connected to the gate of the first transistor, the input terminal of the second bias circuit is connected to the gate of the second transistor, the sources of the first transistor and the second transistor are both grounded, the gate of the first transistor is connected to the first input terminal, the drain of the first transistor is connected to the drain of the third transistor, the gate of the second transistor is connected to the second Input terminal, the drain of the second transistor is connected to the drain of the fourth transistor, the gate of the third transistor is connected to the drain of the fourth transistor, the gate of the fourth transistor is connected to the drain of the third transistor, the sources of the third transistor and the fourth transistor are both connected to a power supply, and the output voltage level is extracted from the drain of the fourth transistor.

5. The level shifter of claim 2, further comprising a second bias circuit, comprising an input terminal and an output terminal, for biasing the body of the second transistor, the shift circuit comprises:

an input terminal for inputting the input voltage level;

a third transistor being a p-channel TFT and comprising a source, a drain, and a gate; and a fourth transistor being a p-channel TFT and comprising a source, a drain, and a gate;

wherein the input terminals of the first bias circuit and the second bias circuit are both connected to the gate of the first transistor, the sources of the first transistor and the second transistor are both grounded, the gate of the first transistor is connected to the input terminal of the shift circuit, the drain of the first transistor is connected to the drain of the third transistor, the gate of the second transistor is connected to the body of the second transistor, the drain of the second transistor is connected to the drain of the fourth transistor, the gate of the third transistor is connected to the drain of the third transistor, the gate of the fourth transistor is connected to the gate of the third transistor, the sources of the third transistor and the fourth transistor are both connected to a power supply, and the output voltage level is extracted from the drain of the fourth transistor.

6. The level shifter of claim 3, herein the first bias circuit comprises an inverter.

7. The level shifter of claim 3, wherein the second bias circuit comprises an inverter.

8. A level shifter for use in TFT-LCDs, comprising:

a shift circuit for shifting from an input voltage level to an output voltage level, comprising:

a first transistor being a n-channel TFT and comprising a source, a drain, a gate, and a body;

a second transistor being a n-channel TFT and comprising a source, a drain, a gate, and a body;

a third transistor being a p-channel TFT and comprising a source, a drain, and a gate; and a fourth transistor being a p-channel TFT and comprising a source, a drain, and a gate; and a first bias circuit, comprising an input terminal and an output terminal;

wherein the output terminal of the first bias circuit is connected to the body of the first transistor to adjust a threshold voltage of the first transistor according to the input voltage level.

9. The level shifter of claim 8, further comprising a second bias circuit, comprising an input terminal and an output terminal, for biasing the body of the second transistor, the shift circuit comprises:

a first input terminal for inputting the input voltage level; and a second input terminal for inputting the input voltage level but with opposite phase;

wherein the input terminal of the first bias circuit is connected to the gate of the first transistor, the input terminal of the second bias circuit is connected to the gate of the second transistor, the sources of the first transistor and the second transistor are both grounded, the gate of the first transistor is connected to the first input terminal, the drain of the first transistor is connected to the drain of the third transistor, the gate of the second transistor is connected to the second input terminal, the drain of second transistor is connected to the drain of the fourth transistor, the gate of the third transistor is connected to the drain of the third transistor, the gate of the fourth transistor is connected to the gate of the third transistor, the sources of the third transistor and the fourth transistor are both connected to a power supply, and the output voltage level is extracted from the drain of the fourth transistor.

10. The level shifter of claim 8, further comprising a second bias circuit, comprising an input terminal and an output terminal, for biasing the body of the second transistor, the shift circuit comprises:

a first input terminal for inputting the input voltage level; and a second input terminal for inputting the input voltage level but with opposite phase;

wherein the input terminal of the first bias circuit is connected to the gate of the first transistor, the input terminal of the second bias circuit is connected to the gate of the second transistor, the sources of the first transistor and the second transistor are both grounded, the gate of the first transistor is connected to the first input terminal, the drain of the first transistor is connected to the drain of the third transistor, the gate of the second transistor is connected to the second input terminal, the drain of the second transistor is connected to the drain of the fourth transistor, the gate of the third transistor is connected to the drain of the fourth transistor, the gate of the fourth transistor is connected to the drain of the third transistor, the sources of the third transistor and the fourth transistor are both connected to a power supply, and the output voltage level is extracted from the drain of the fourth transistor.

11. The level shifter of claim 8, further comprising a second bias circuit, comprising an input terminal and an output terminal, for biasing the body of the second transistor, the shift circuit comprises:

an input terminal for inputting the input voltage level;

wherein the input terminals of the first bias circuit and the second bias circuit are both connected to the gate of the first transistor, the sources of the first transistor and the second transistor are both grounded, the gate of the first transistor is connected to the input terminal of the shift circuit, the drain of the first transistor is connected to the drain of the third transistor, the gate of the second transistor is connected to the body of the second transistor, the drain of the second transistor is connected to the drain of the fourth transistor, the gate of the third transistor is connected to the drain of the third transistor, the gate of the fourth transistor is connected to the gate of the third transistor, the sources of the third transistor and the fourth transistor are both connected to a power supply, and the output voltage level is extracted from the drain of the fourth transistor.

12. The level shifter of claim 9, wherein the first bias circuit comprises an inverter.

13. The level shifter of claim 9, wherein the second bias circuit comprises an inverter.

14. A level shifter for use in TFT-LCDs, comprising:
a first input terminal for inputting the input voltage level;
a second input terminal for inputting the input voltage level but with opposite phase;
a shift circuit for shifting from an input voltage level to an output voltage level, comprising:
  a first transistor being a n-channel TFT and comprising a source, a drain, a gate, and a body;
  a second transistor being a n-channel TFT and comprising a source, a drain, a gate, and a body;
  a third transistor being a p-channel TFT and comprising a source, a drain, and a gate; and
  a fourth transistor being a p-channel TFT and comprising a source, a drain, and a gate;
a first bias circuit, comprising an input terminal and an output terminal, for biasing the body of the first transistor; and
a second bias circuit, comprising an input terminal and an output terminal, for biasing the body of the second transistor;
wherein the input terminal of the first bias circuit is connected to the gate of the first transistor, the input terminal of the second bias circuit is connected to the gate of the second transistor, the output terminal of the first bias circuit is connected to the body of the first transistor, the output terminal of the second bias circuit is connected to the body of the second transistor, the gate of the first transistor is connected to the first input terminal, and the gate of the second transistor is connected to the second input terminal.

15. The level shifter of claim 14, wherein the sources of the first transistor and the second transistor are both grounded, the drain of the first transistor is connected to the drain of the third transistor, the drain of second transistor is connected to the drain of the fourth transistor, the gate of the third transistor is connected to the drain of the third transistor, the gate of the fourth transistor is connected to the gate of the third transistor, the sources of the third transistor and the fourth transistor are both connected to a power supply, and the output voltage level is extracted from the drain of the fourth transistor.

16. The level shifter of claim 14, wherein the sources of the first transistor and the second transistor are both grounded, the drain of the first transistor is connected to the drain of the third transistor, the drain of the second transistor is connected to the drain of the fourth transistor, the gate of the third transistor is connected to the drain of the fourth transistor, the gate of the fourth transistor is connected to the drain of the third transistor, the sources of the third transistor and the fourth transistor are both connected to a power supply, and the output voltage level is extracted from the drain of the fourth transistor.

17. The level shifter of claim 15, wherein the first bias circuit comprises an inverter.

18. The level shifter of claim 15, wherein the second bias circuit comprises an inverter.

* * * * *